US006653030B2

United States Patent
Mei et al.

(10) Patent No.: US 6,653,030 B2
(45) Date of Patent: Nov. 25, 2003

(54) OPTICAL-MECHANICAL FEATURE FABRICATION DURING MANUFACTURE OF SEMICONDUCTORS AND OTHER MICRO-DEVICES AND NANO-DEVICES THAT INCLUDE MICRON AND SUB-MICRON FEATURES

(75) Inventors: Ping Mei, Palo Alto, CA (US); Carl P. Taussig, Redwood City, CA (US); Albert H Jeans, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 10/058,744

(22) Filed: Jan. 23, 2002

(65) Prior Publication Data

US 2003/0138704 A1 Jul. 24, 2003

(51) Int. Cl.⁷ .................................. G03F 7/20
(52) U.S. Cl. ..................... 430/5; 430/325; 430/326; 430/396
(58) Field of Search ................. 430/5, 396, 325, 430/326

(56) References Cited

U.S. PATENT DOCUMENTS 5,259,926 A  * 11/1993 Kuwabara et al. ....... 156/659.1
2002/0115002 A1 * 8/2002 Bailet et al. .................. 430/5

FOREIGN PATENT DOCUMENTS

WO        WO 99/15933       *  4/1999

* cited by examiner

*Primary Examiner*—John A. McPherson

(57) ABSTRACT

A method and system for fabricating micron and sub-micron-sized features within a polymer layer of a nascent semiconductor device or other micro-device or nano-device. Small features are directly imprinted with an optical-mechanical stamp having corresponding intrusions. Large features are created by exposing the surface of selected areas of the polymer surface to UV radiation by transmitting UV radiation through the optical-mechanical stamp to chemically alter the polymer, allowing either UV-exposed or UV-shielded areas to be removed by solvents. Thus, described embodiments of the present invention provide for a partially transparent imprinting mask that employs purely mechanical stamping for fine features and lithography-like chemical polymer removal for large features.

11 Claims, 11 Drawing Sheets

OPTICAL-MECHANICAL FEATURE FABRICATION DURING MANUFACTURE OF SEMICONDUCTORS AND OTHER MICRO-DEVICES AND NANO-DEVICES THAT INCLUDE MICRON AND SUB-MICRON FEATURES

TECHNICAL FIELD

The present invention relates to the manufacture of semiconductors, electrical, electro-mechanical, micro-mechanical, and electro-optical devices that include micron and sub-micron-sized features and, in particular, to a method and system for creating micron and sub-micron-sized features in thin polymer films during layer-by-layer fabrication of micron-feature-containing devices and sub-micron-feature-containing devices.

BACKGROUND OF THE INVENTION

The present invention finds application in the manufacture of many types of modern electronic, electro-magnetic, micro-mechanical, and electro-optical devices that contain tiny, micron and sub-micron-sized elements and components. In the following, such devices are referred to as micro-devices and nano-devices.

One common application of the method and system of the present invention occurs in semiconductor fabrication. During semiconductor fabrication, a semiconductor device is built layer-by-layer on top of a silicon, glass, or polymer substrate. These substrates can be rigid or flexible. Tiny features, such as signal lines and transistors, are fabricated using well-known photolithographic methodologies. FIGS. 1A–H illustrate the general method by which micron and sub-micron features are currently fabricated during manufacture of a semiconductor. In FIG. 1A, a rectangular section of a silicon substrate 101 is shown. The substrate may be a planarized silicon, glass, or polymer layer, or may be a planarized surface of an already partially fabricated semiconductor. In FIG. 1B, an oxide layer 102 is laid down on top of, or grown at the surface of, the substrate 101. In FIG. 1C, a thin photoresist layer 103 is laid down on top of the oxide layer 102.

A photolithography mask is next placed above the surface of the photoresist, and ultraviolet ("UV") light is directed through the photolithography mask onto the surface of the photoresist layer 103. The photolithography mask has transparent regions and opaque regions that define the design of features to be fabricated in the oxide layer 102 below the photoresist layer 103. The photolithography mask can be either a positive mask or a negative mask, depending on whether the photoresist layer 103 positively or negatively responds to exposure to UV radiation. In the examples shown in FIGS. 1A–H, photoresist material exposed to UV radiation is chemically altered, degrading the photoresist and making the photoresist susceptible to dissolution in solvents. The photolithography mask has transparent regions representing features, and UV radiation is blocked from transmission through opaque, non-feature areas of the photolithography mask. Thus, following transmission of UV radiation through the photolithography mask onto the surface of the photoresist layer, areas of the photoresist layer are chemically altered, while non-feature areas remain resistant to dissolution in solvent.

FIG. 1D illustrates the photoresist layer following transmission of UV radiation through a photolithography mask onto the surface of the photoresist layer. The chemically altered portions of the photoresist 104 and 105 were positioned below transparent regions of the photolithography mask. In a next step, the chemically altered portions of the photoresist layer 103 are removed by exposure of the photoresist layer to a solvent. The removal of the chemically altered photoresist regions leave shallow channels within the photoresist layer, exposing oxide at the bottom of the channels. Next, the oxide layer 102 below the photoresist layer is chemically etched, or etched by a beam of charged particles, to form channels in the polymer layer corresponding to the shallow feature channels in the photoresist. The etching method etches exposed oxide, but is blocked by the remaining photoresist layers that were not chemically degraded by UV exposure. Following etching of the oxide layer, the remaining photoresist is removed by chemical or mechanical processes.

FIG. 1E shows feature channels etched into the oxide layer by the above-described etching step. The channels 106 and 107 correspond to the feature pattern (104 and 105 in FIG. 1B) created in the photoresist layer by UV radiation exposure. Assuming that the features are metal signal lines, in a next step, a metal layer 108 is deposited onto the surface of the oxide layer 102, filling the feature channels and adding an additional layer above the oxide layer. FIG. 1F illustrates the rectangular portion of the nascent semiconductor device following application of the metal layer. Next, the surface of the nascent semiconductor device is chemically or mechanically planarized to remove the metal layer, leaving metal signal lines embedded within the oxide layer. FIG. 1G illustrates the oxide layer with embedded signal lines. Finally, a subsequent polymer, poly-silicon, silicon-oxide, or other type of layer can be laid down on top of the oxide layer for creation of additional features above the features created in the oxide layer 102. The steps illustrated in FIGS. 1A–H can be repeated a number of times to create a complex, three-dimensional array of features within layers of the semiconductor device.

The traditional photolithography-based feature fabrication steps illustrated in FIGS. 1A–H have been used for decades to produce ever smaller and more finely detailed semiconductor devices. However, photolithography has numerous deficiencies. A well-known deficiency is the resolution constraints imposed by patterning photoresist layers using UV radiation. Edge-diffraction effects dull the resolution of projected patterns, and edge-diffraction effects become more significant as feature sizes decrease. Another disadvantage of lithography techniques, in general, is that they require many successive, complex steps in order to fabricate features within a particular layer of a semiconductor device. Each step may require careful alignment procedures and expensive and time-consuming chemical, mechanical, vapor-deposition, and charged-particle-beam-based procedures that contribute enormous expense both to creating fabrication facilities as well as to producing finished semiconductor devices. Yet another disadvantage of lithography techniques is that they require a flat surface, so that the entire surface to which patterns of UV radiation are applied remain within a narrow depth of focus. It is thus difficult to apply photolithography techniques to fabricate micron and sub-micron features on inherently difficult-to-planarize surfaces, such as plastic sheets.

In order to overcome the feature-size limitations inherent in photolithographic methodologies, semiconductor manufacturers are developing soft X-ray photolithography methods, and may eventually attempt to employ even shorter-wavelength radiation in order to decrease features sizes to nanometer and sub-nanometer ranges. However, these short-wavelength-radiation techniques are not yet fully commercialized, and are extremely expensive, especially in regard to the capital costs for retooling complex semiconductor manufacturing facilities, mask preparation, and mask/device alignment. However, semiconductor manufacturers are under constant economic pressure to produce smaller and smaller feature sizes, in order to continue to increase the density of microelectronic circuits within semiconductor devices. Moreover, many newer applications for micro-devices and nano-devices are being developed, including complex micro-electromechanical systems, such as sensors and miniature chemical-analysis systems, molecular analysis arrays, electro-optical devices, and other such products of new technologies. Designers, manufacturers, and users of semiconductor devices and other types of micro-devices and nano-devices all recognize the need for micron and sub-micron-feature-fabrication methodologies to economically produce smaller and smaller features and correspondingly increase the density of features within semiconductor devices and other such devices.

SUMMARY OF THE INVENTION

One embodiment of the present invention is a method and system for fabricating micron and sub-micron-sized features within a polymer layer of a nascent semiconductor device or other micro-device or nano-device. Small features are directly imprinted by imprinting a viscous, thin polymer surface with an optical-mechanical stamp having corresponding intrusions, or by embossing a low-viscosity polymer film by drawing the low-viscosity polymer into spaces between intrusions via capillary action. Large features are created by exposing the surface of selected areas of the polymer surface to UV radiation by transmitting UV radiation through the optical-mechanical stamp to chemically alter the polymer, allowing either UV-exposed or UV-shielded areas to be removed by solvents. Thus, described embodiments of the present invention provide for a partially transparent imprinting mask that employs purely mechanical stamping for fine features and lithography-like chemical polymer removal for large features.

DETAILED DESCRIPTION OF THE INVENTION

One embodiment of the present invention provides an optical-mechanical pattern-imprinting mask ("OMPIM") for imprinting features into a layer of a nascent semiconductor device, micro-device, or nano-device. Mechanical pattern imprinting can achieve higher resolution, or, in other words, can often more economically imprint small features than currently available photolithography methods. Moreover, mechanical pattern imprinting can greatly decrease the number of steps required to pattern features onto layers of a micro-device or nano-device. However, mechanical pattern imprinting is significantly constrained by disparities in the sizes of features within a layer, rather than being constrained by the sizes of the features, as are currently available photolithography methods, down to feature sizes in the tens of nanometers range. One embodiment of the present invention removes the feature-size-disparity constraint by employing photolithography-like techniques for fabricating large features with purely mechanical stamping methods for fabricating small features.

Figure 1A:
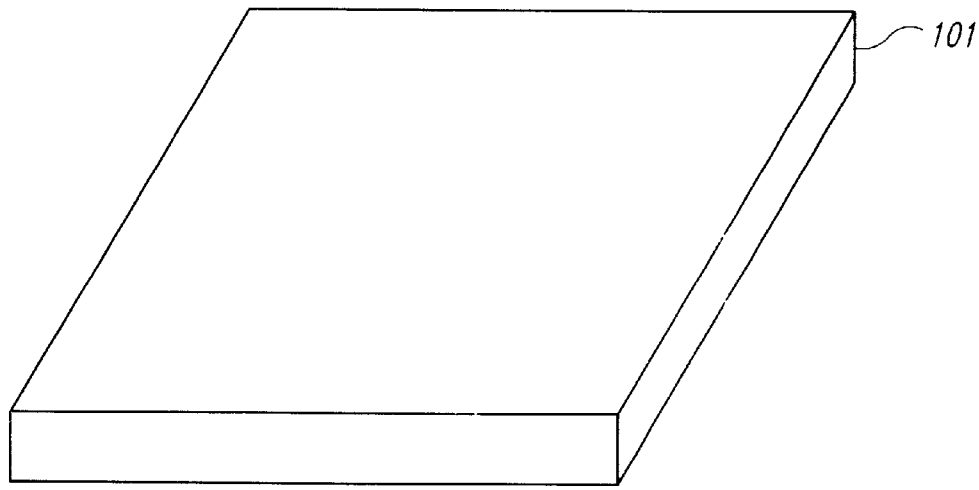
FIGS. 1A–H illustrate the general method by which micron and sub-micron features are currently fabricated during manufacture of a semiconductor.
Figure 1B:
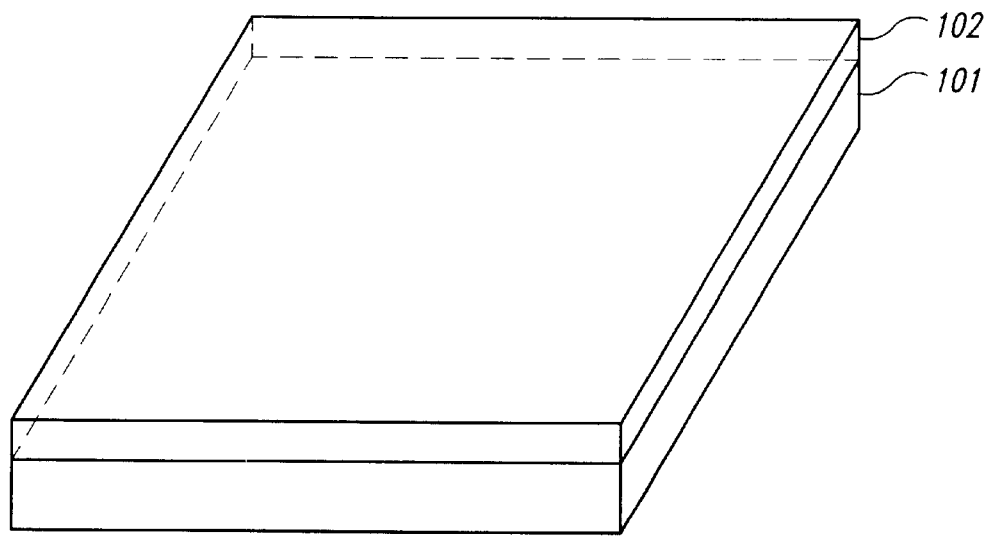
Figure 1C:
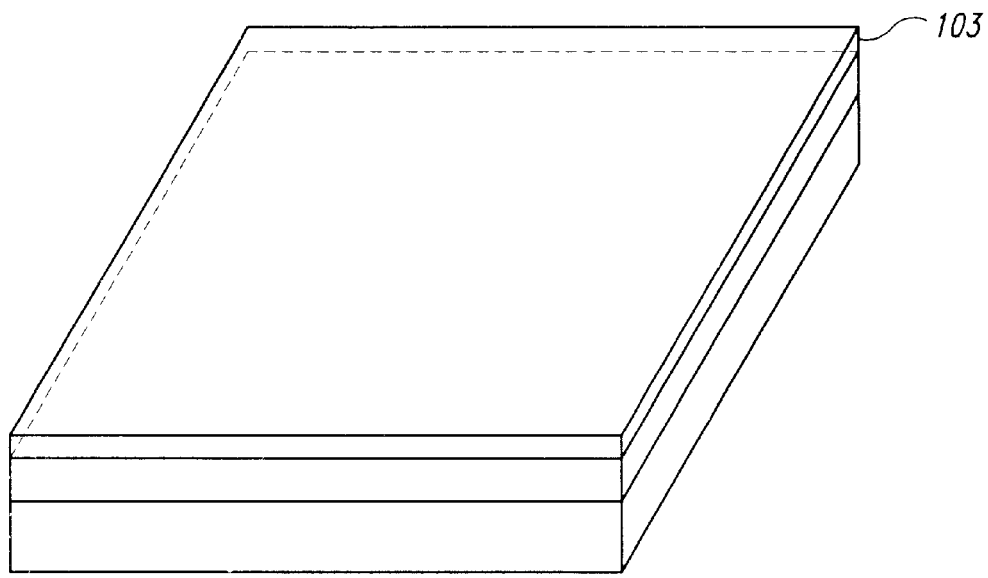
Figure 1D:
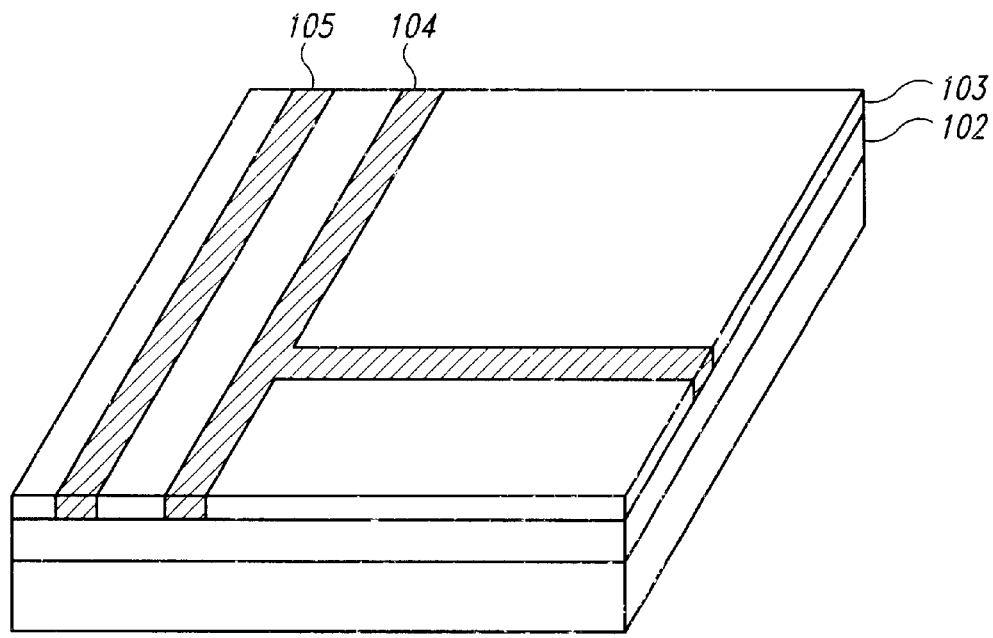
Figure 1E:
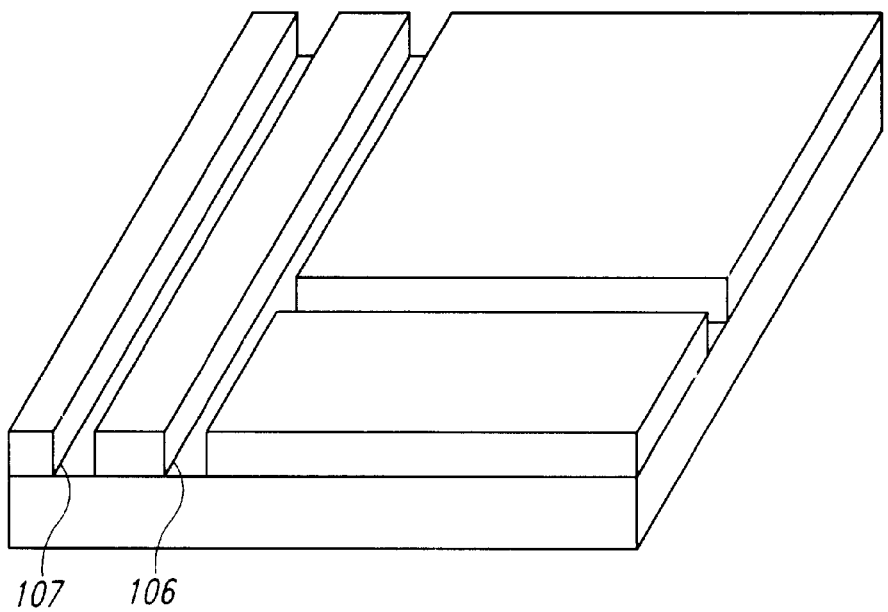
Figure 1F:
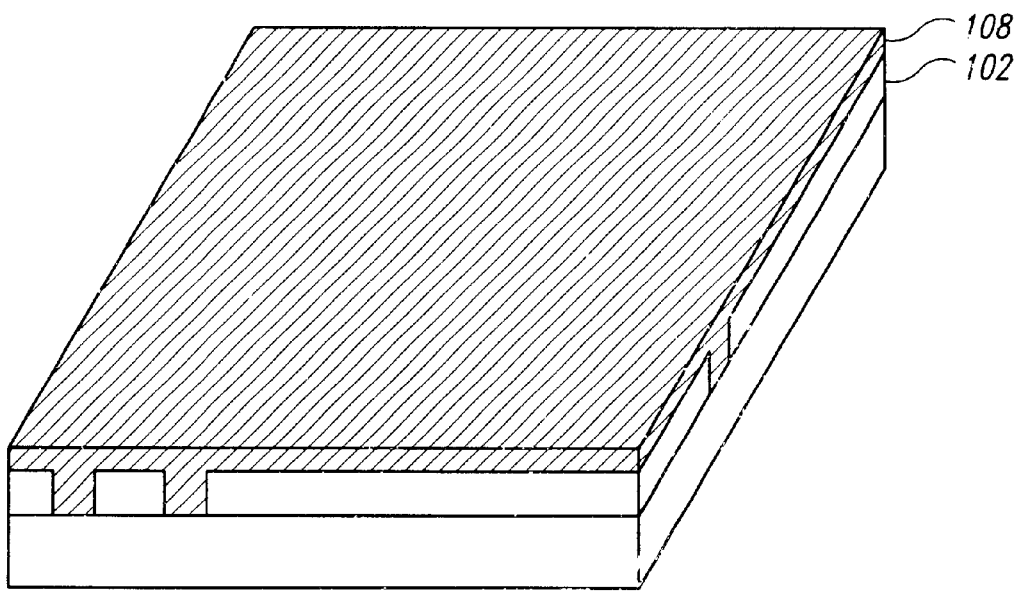
Figure 1G:
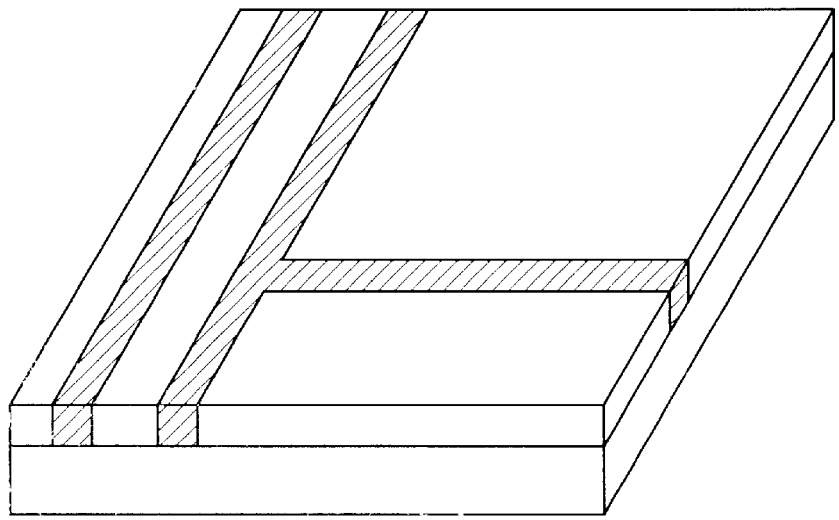
Figure 1H:
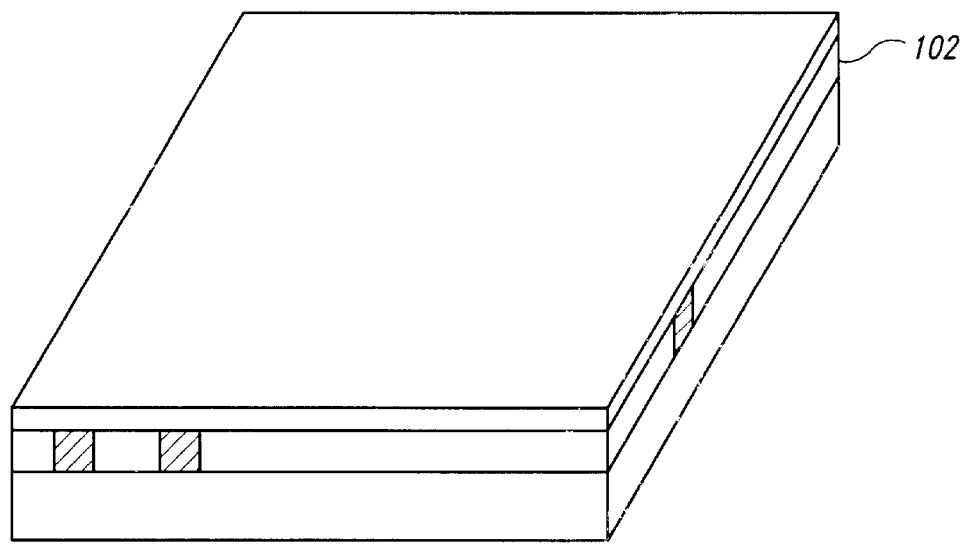
Figure 2A:
FIGS. 2A–F illustrate the mechanical pattern-imprinting technique used to imprint features into the layer of a nascent micro-device or nano-device.
Figure 2B:
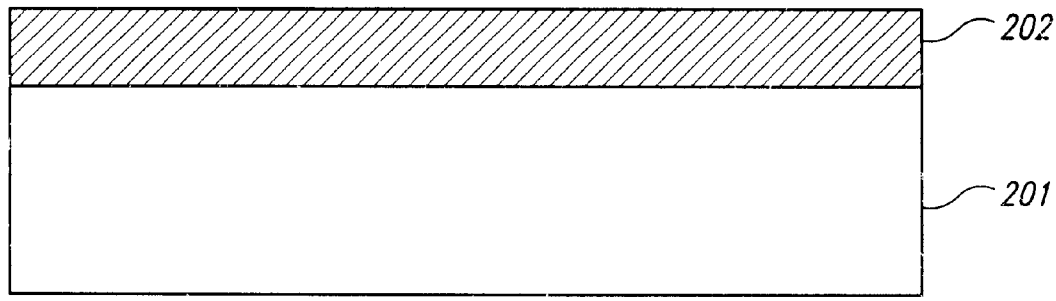
Figure 2C:
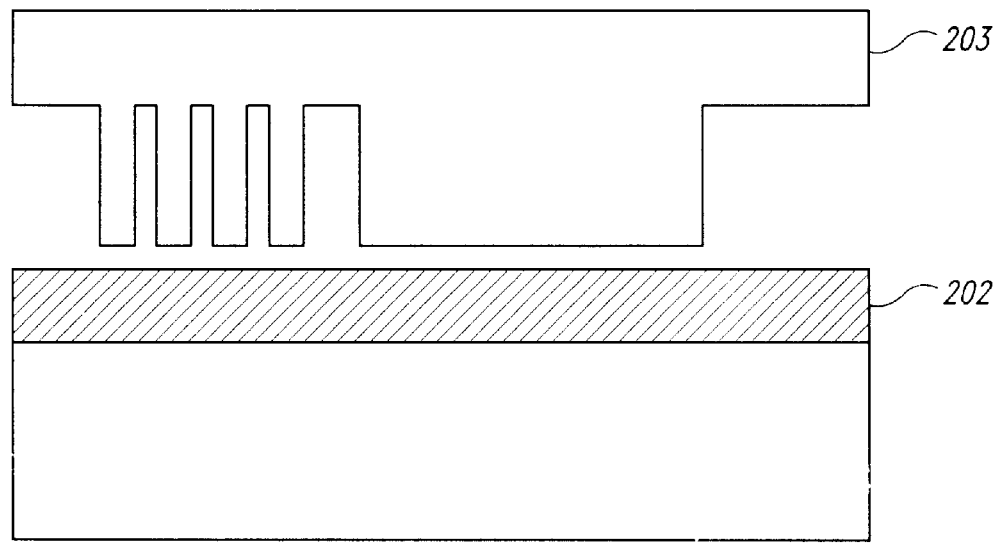
Figure 2D:
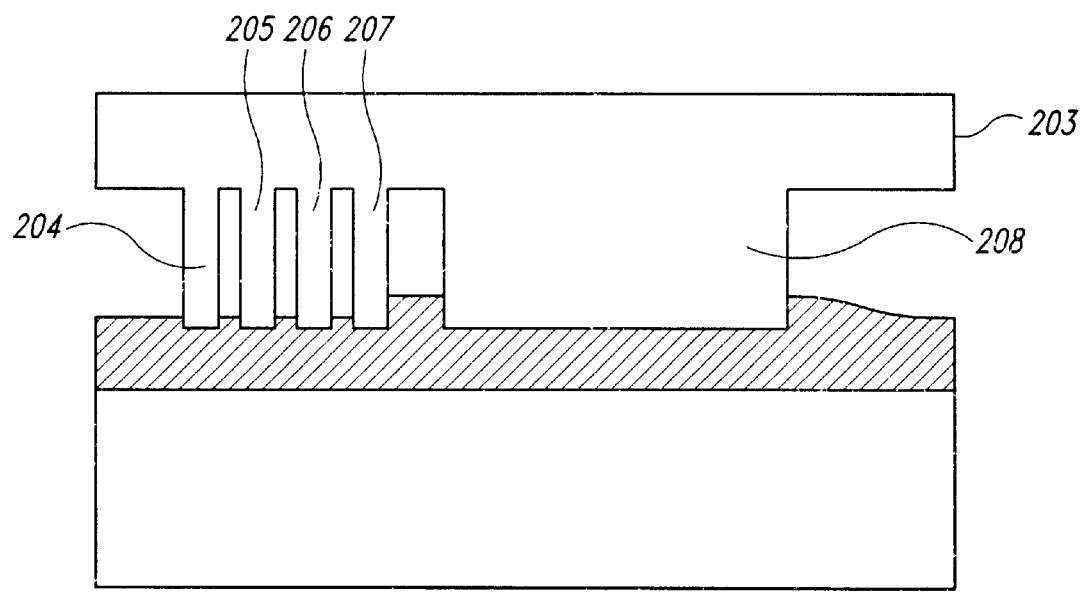
Figure 2E:
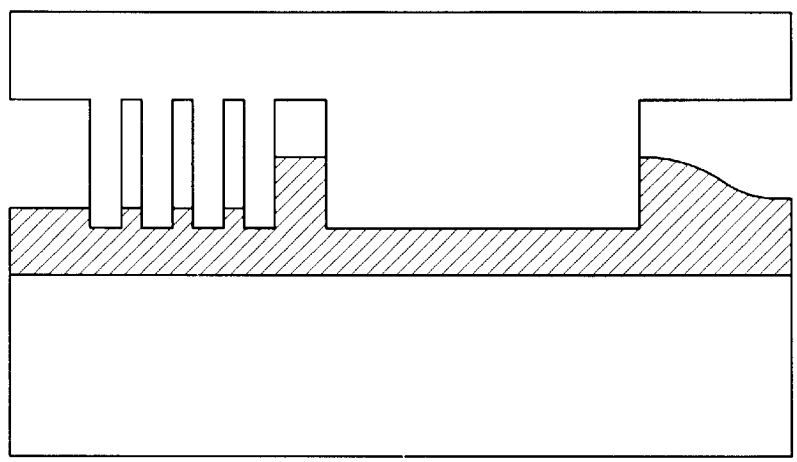
Figure 2F:
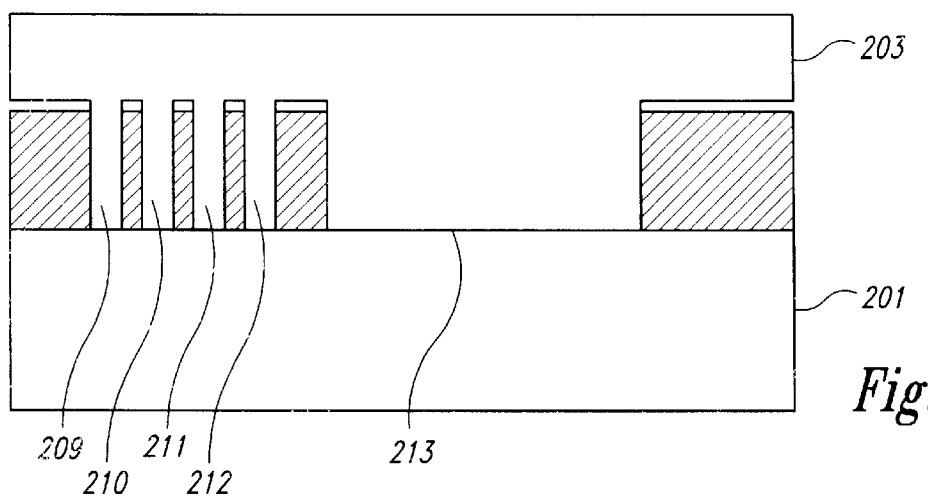

FIGS. 2A–F illustrate the mechanical pattern-imprinting technique used to imprint features into the layer of a nascent nano-device. In FIGS. 2A–F, and in subsequent figures, substrates and layers are shown in cross-section for clarity of illustration. These figures show only a tiny portion of the cross section of an entire, nascent micro-device or nano-device, which may contain many tens of millions of features. FIG. 2A shows a rigid or flexible substrate on which a next feature-containing layer is to be fabricated. The substrate may be made from various materials, including glass, poly-silicon, silicon, or various polymers. In a first step, a viscous polymer layer is applied to the surface of the substrate. FIG. 2B shows the polymer layer 202 layered above the substrate 201. Next, a mechanical pattern-imprinting mask is positioned above the surface of the newly added polymer layer, as shown in FIG. 2C. The mechanical pattern-imprinting mask is then pressed into the polymer layer. Note that that the substrate need not be planar. For example, the substrate may be shaped like a convex, outer section of the surface of a cylinder. In this case, the mechanical pattern-imprinting mask would have a corresponding concave surface to enable the entire surface of the mechanical pattern-imprinting mask to be simultaneously placed in contact with the substrate surface. Many other substrate/mask complementary surface shapes are possible. FIGS. 2D–F show pressing of the mechanical pattern-imprinting mask 203 through the polymer layer 202 onto the substrate 201. The mechanical pattern-imprinting mask 203 includes intrusions 204–208 that create narrow troughs and wide troughs in the polymer layer as the mechanical pattern-imprinting mask is pressed into the polymer layer. It is the intent of the mechanical stamping procedure to press the mechanical pattern-imprinting mask 203 as closely as possible to the substrate 201, as shown in FIG. 2F. When the mechanical pattern-imprinting mask 203 is subsequently removed, troughs remain in the polymer layer in positions corresponding to the intrusions 204–207, and a wide trough 213 in the polymer layer remains in a position corresponding to the wide intrusion 208. Note that, as the mechanical pattern-imprinting mask is pressed further and further into the polymer layer 201 in FIGS. 2D–F, the height of the polymer layer within wide troughs between the intrusions increases as the polymer is displaced from below the intrusions, particularly from below the wide intrusion 208.

Figure 3:
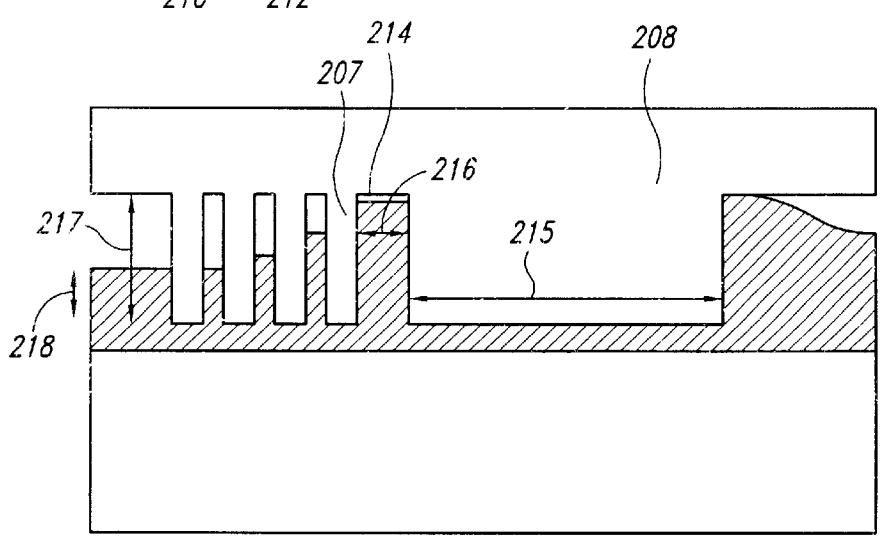
FIG. 3 illustrates a problem that may arise when a large or wide intrusion of a mechanical pattern-imprinting mask is located next to one or more narrow mechanical-pattern-imprinting-mask intrusions.

Unfortunately, because of disparities in feature sizes, it may not be possible to press the mechanical pattern-imprinting mask to a desired depth within the polymer layer. FIG. 3 illustrates a problem that may arise when a large or wide intrusion of a mechanical pattern-imprinting mask is located next to one or more narrow intrusions. Note that the viscous polymer, displaced from below the wide intrusion 208, has pushed up almost to the top of the wide trough 214 between wide intrusion 208 and narrow intrusion 207. No further polymer can be displaced from beneath the wide intrusion 208 into wide trough 214. Furthermore, because the polymer is quite viscous, much higher pressures would be needed to displace the polymer laterally into neighboring wide troughs or regions. Thus, in general, the volume of polymer displaced by a wide intrusion, such as intrusion 208, must be accommodated within neighboring wide troughs, such as wide trough 214.

Assuming that, in the example shown in FIG. 3, the width 215 of the wide intrusion is $w_1$, the width 216 of the wide trough to the left of the wide intrusion is $w_2$, the height 217 of the intrusions of the mechanical pattern-imprinting mask is h, and the depth 218 to which the intrusions are pressed into the polymer layer is d, and assuming that the intrusions and wide troughs are linear, with a dimension x in a direction perpendicular to the plane of FIG. 3, the volume of polymer displaced by wide intrusion 208 is:

$$w_1 dx$$

the volume of wide trough 214 is:

$$w_2 hx$$

As discussed above, the volume of the wide trough must be greater than half of the volume of displaced polymer from the wide intrusion 208:

$$\tfrac{1}{2} w_1 dx < w_2 hx$$

$$w_1 d < 2 w_2 h$$

$$\frac{w_1 d}{h} < 2 w_2$$

Thus, in order to alleviate the problem illustrated in FIG. 3, one might decide to decrease the aspect ratio $$\frac{w_1}{h}$$

of the mechanical pattern-imprinting mask intrusions to the point that the volume of the wide troughs between intrusions increases to a size to accommodate the displaced polymer. However, the aspect ratios for the intrusions of mechanical pattern-imprinting masks are limited, by various mechanical and fluid-flow constraints. For polydimethyl siloxane ("PDMS") masks, for example, aspect ratios need to be greater than or equal to 1:3.

Another problem with wide mechanical pattern-imprinting intrusions is that the time required to press the mask through the polymer layer to the underlying substrate is proportional, at least for a portion of the insertion process, to the square of the ratio of the polymer layer depth, d, to the thickness of the polymer layer between the bottom of the wide intrusion and the substrate surface, $d_t$, as follows:

$$t = \frac{v w_1}{2 P d}\left[\left(\frac{d}{d_t}\right)^2 - 1\right]$$

where v=the viscosity of the polymer,
P=pressure exerted on the mechanical pattern-imprinting stamp, and
t=time in seconds.

The greater the width of an intrusion, the greater the time required to force the mechanical pattern-imprinting mask intrusion through the polymer layer to a desired depth. It is possible to use low-visosity polymers to attempt to alleviate the problems discussed above, but while low-viscosity polymers may be more easily displaced, they are also preferentially drawn into narrow mask troughs by capillary action, depleting the polymer in wider mask troughs.

Alternatively, mechanical imprinting may be carried out on surfaces coated with a thin layer of a low-viscosity, fluid polymer solution. In these applications, enough polymer solution is present to completely fill all troughs by capillary action. However, the need to effectively remove large areas of cured polymer still points to the need for a way of treating these wide areas differently from the narrow areas.

Figure 4A:
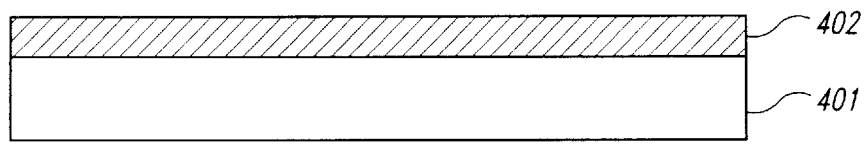
FIGS. 4A–D and 5A–D illustrate optical-mechanical pattern imprinting provided by two different embodiments of the present invention.
Figure 4B:
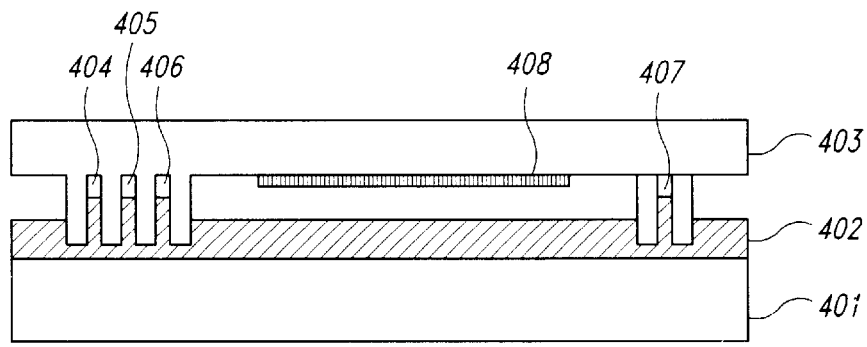

To overcome the above-described problems, one embodiment of the present invention provides an optical-mechanical pattern-imprinting mask ("OMPIM") that combines mechanical stamping with lithography-like, UV-radiation-induced differential polymer curing and chemical removal of uncured polymer. FIGS. 4A–D and 5A–D illustrate optical-mechanical pattern imprinting provided by two different embodiments of the present invention. FIG. 4A shows a substrate 401 on top of which a UV-curable polymer layer 402, such as a Norland NOA optical adhesive polymer or 1,6-hexanediol diacrylate mixed with Citageigy Irgacure 651, has been applied. The UV-curable polymer layer needs to be imprinted with narrow troughs and wide troughs corresponding to features that will be embedded within the UV-curable polymer layer 402. As shown in FIG. 4B, an OMPIM 403 is pressed down onto the polymer layer, with intrusions of the OMPIM 403 pressed nearly to the surface of the substrate 401 and with displaced polymer rising into the wide troughs 404–407 between features of the OMPIM.

Figure 4C:
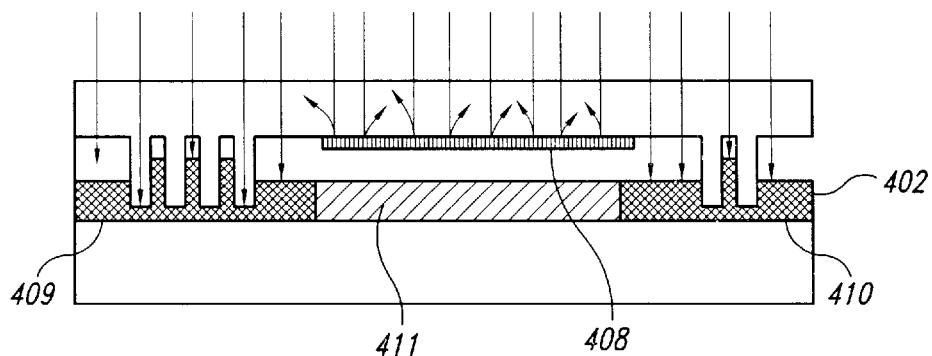
Figure 4D:
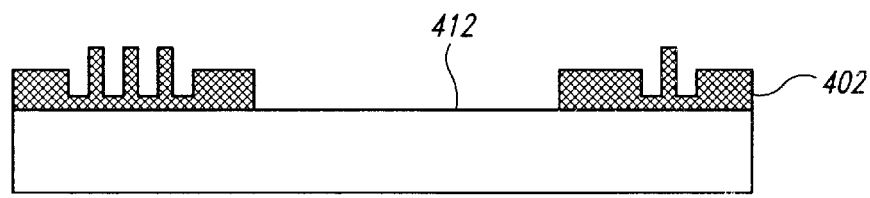

The OMPIM 403 includes, in addition to intrusions, a UV block 408 corresponding to a wide feature needed to be imprinted into the polymer layer. The OMPIM is, itself, transparent to UV radiation. The OMPIM can be made from PDMS, quartz, glass, or other UV-transparent materials using molding, etching, or deposition techniques to fabricate mask intrusions and other mask features. In FIG. 4B, small features corresponding to OMPIM intrusions have been imprinted into the UV-curable polymer layer 402, but a wide central feature has not. Next, as shown in FIG. 4C, UV radiation is transmitted through the OMPIM onto the surface of the UV-curable polymer layer 402. The UV radiation is transmitted through all regions of the OMPIM except for the region blocked by the UV mask 408. Illumination of the mask with UV radiation results in curing of those portions of the polymer layer 410 exposed to UV radiation transmitted through the OMPIM, but the polymer 411 shielded from exposure to UV radiation by the UV mask 408 remains uncured. Finally, as shown in FIG. 4D, the OMPIM is removed and the uncured polymer removed from the substrate by dissolving the uncured polymer in a solvent. Note that any remaining cured polymer at the bottom of the narrow troughs and wide troughs may be removed by anisotropic oxygen-plasma etching. Thus, both narrow and wide features have been imprinted into the polymer layer 402, the narrow features imprinted by purely mechanical means, and the wide, trough-like feature 412 created by a photolithography-like method that induces differential chemical stability into regions of the polymer layer via UV radiation. Note that edge-diffraction effects may blur wide features somewhat, but are generally insignificant for the wide features fabricated using the lithography-like technique, while the purely mechanical stamping of small features provides a sharpness unavailable from lithographic techniques employing UV radiation due to diffraction effects.

Figure 5A:
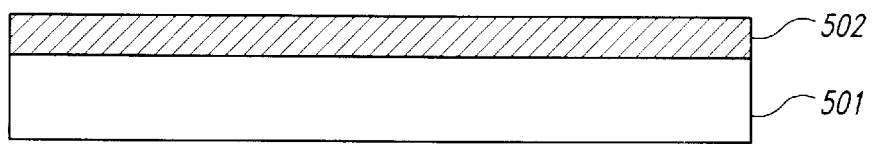
Figure 5B:
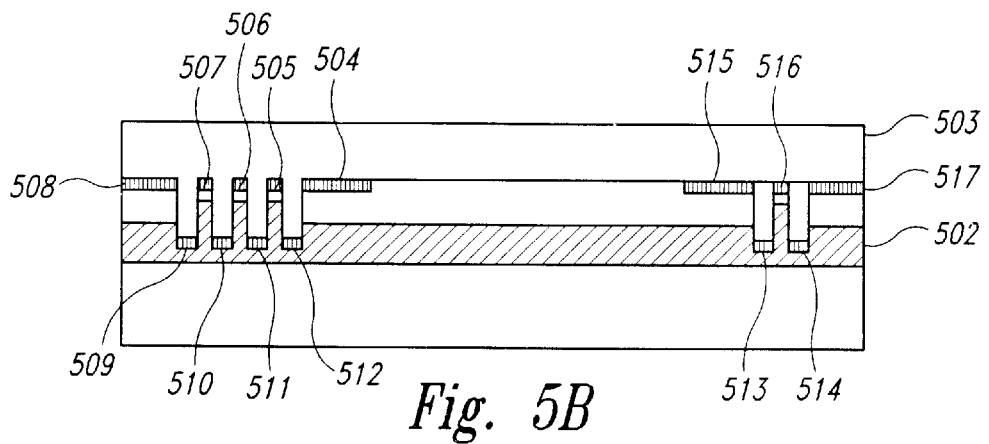
Figure 5C:
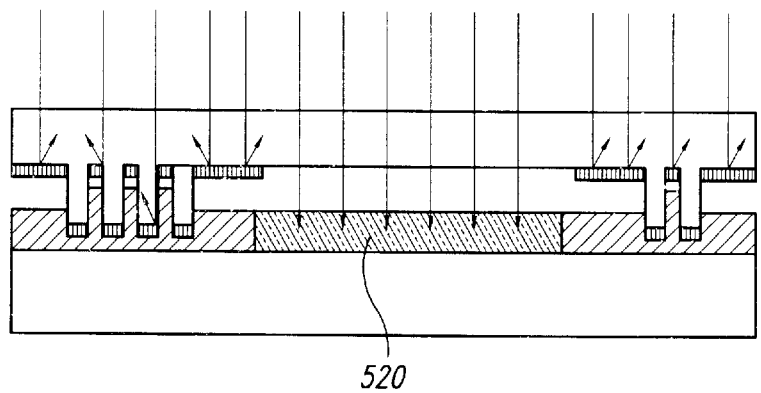
Figure 5D:
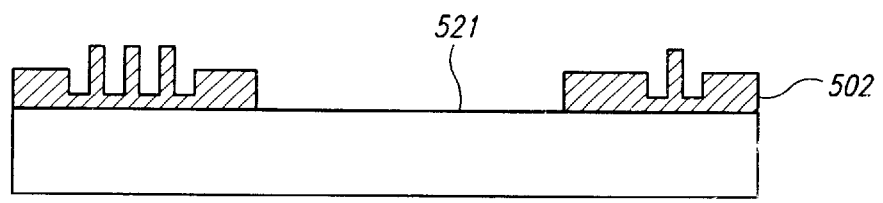

A polymer that is inhibited from curing by exposure to UV radiation, referred to in the following as a "negative polymer," may be employed with an OMPIM having UV blocks in an orientation opposite from those in the previously described embodiment. This alternate OMPIM and OMPIM-based method is illustrated in FIGS. 5A–D. A negative polymer layer 502 is applied to the surface of a substrate 501, as illustrated in FIG. 5A. Next, an OMPIM 503 is pressed into the negative polymer layer 502, as shown in FIG. 5B. The OMPIM 503 includes UV blocking regions 504–517, and is otherwise UV transparent. UV radiation is then transmitted through the OMPIM onto the negative polymer layer, as shown in FIG. 5C. UV radiation is blocked by the UV blocking regions 504–517, and passes through the non-UV-blocking region to expose and chemically alter a region of the negative polymer 520 underlying the non-UV-blocking region. The non-UV-exposed polymer may then be thermally cured prior to releasing the stamp. To facilitate a clean releasing of the stamp, the surface of the stamp should not have chemical affinity for uncured polymer. For example, if the uncured polymer is hydrophilic, then the surface of the stamp should be hydrophobic. The UV-exposed polymer is not cured by application of heat. The chemically altered region of the negative polymer can then be dissolved with a solvent, such as acetone, following removal of the OMPIM, as shown in FIG. 5D. As in the previous embodiment, described with reference to FIGS. 5A–D, narrow features have been imprinted onto the polymer layer 502 by purely mechanical means, and a wide, trough-like feature 521 has been fabricated via photolithography-like techniques by introducing differential chemical stabilities into the polymer region via selective exposure to UV radiation.

Figure 6A:
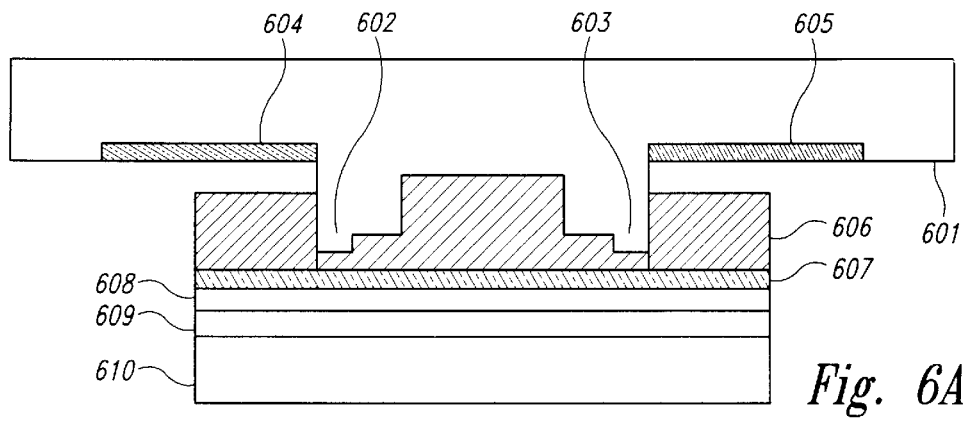
FIGS. 6A–D illustrate fabrication of a poly-silicon thin-film transistor using an optical-mechanical pattern imprinting mask that represents an embodiment of the present invention.
Figure 6B:
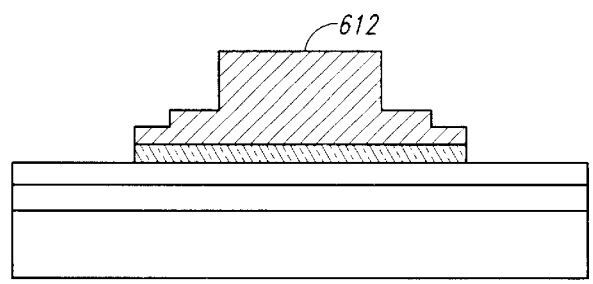
Figure 6C:
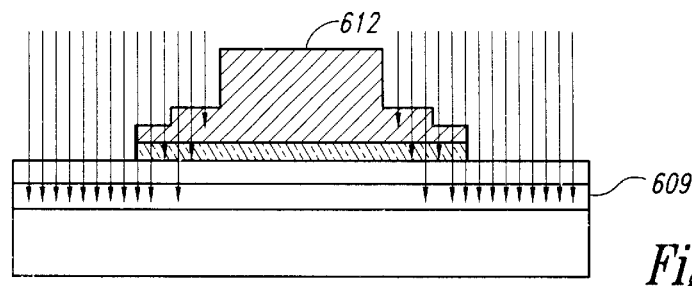
Figure 6D:
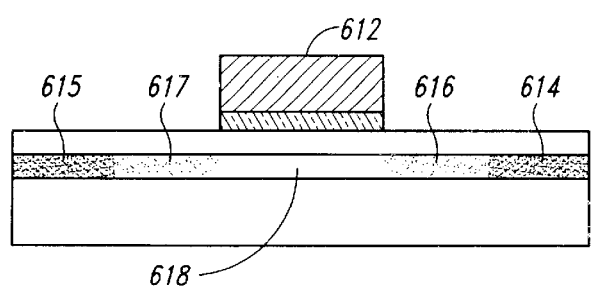

FIGS. 6A–D illustrate fabrication of a poly-silicon thin-film transistor using an OMPIM that represents another embodiment of the present invention. FIG. 6A illustrates an OMPIM 601 with two stepped intrusions 602 and 603 flanked by two UV blocking regions 604 and 605. The OMPIM has been pressed into a UV-curable polymer layer 606 applied above a gate-metal layer 607, a gate-insulator layer 608, a poly-silicon layer 609, and a substrate 610. The OMPIM and underlying UV-curable polymer are illuminated with UV radiation in order to cure the polymer between the two-stepped intrusions 602–603. The polymer below the two UV blocks 604 and 605 remains uncured. The OMPIM is removed and uncured polymer dissolved in solvent to produce the stepped, UV-cured polymer feature 612 shown in FIG. 6B. Note that the gate-metal unprotected by the polymer feature 612 has been removed, in FIG. 6B, by a method that removes metal unprotected by UV-cured polymer 612. Next, as shown in FIG. 6C, ion implantation via a charged particle beam is employed to dope the poly-silicon layer 609. The doping level is highest. or, in other words, a higher concentration of dopant is produced, when the charged ions pass through as few overlying layers as possible. Thus, the doping level is highest in areas not covered by the UV-cured polymer feature 612, is lowest or absent, directly underneath the central portion of the UV-cured polymer feature 612, and is intermediate below the stepped portions of the UV-curable polymer feature 612. The implanted ions are then activated by thermal annealing or laser annealing. The stepped portion of the UV-cured polymer is next removed, and the gate-metal beneath this portion is removed by a metal etch. Finally, the polymer collar above the gate-metal is removed. The differential doping produces, as shown in FIG. 6D, fully doped poly-silicon-layer regions 614 and 615, lightly doped poly-silicon-layer regions 616 and 617, and essentially undoped poly-silicon-layer region 618. This differentially doped thin-film transistor is known as a lightly doped source/drain thin-film transistor. The low doping levels near the drain region of the transistor reduces the electrical field near the drain region during operation. Reduction of the electrical field, in turn, improves transistor performance by reducing field-induced source/drain current leakage in the "off" state and reducing rapid increase of source/drain current when the state is switched to the "on" state.

Figure 7A:
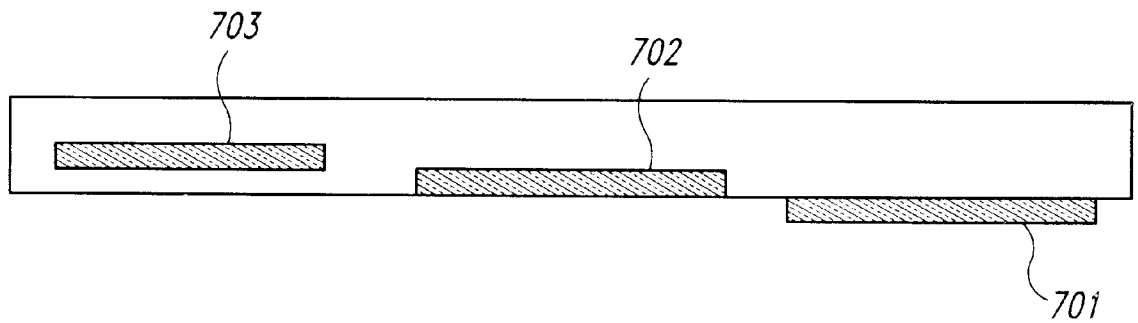
FIGS. 7A and 7B illustrate variations in the UV-blocking features and intrusion features of an optical-mechanical pattern-imprinting mask.
Figure 7B:
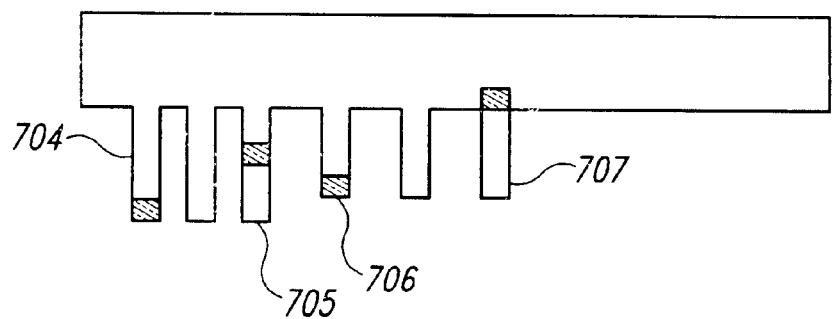

FIGS. 7A and 7B illustrate variations in the UV-blocking regions and intrusion features of an OMPIM. As shown in FIG. 7A, a UV blocking region may be fixed to a surface of the OMPIM 701, implanted flush with the surface of the OMPIM 702, or embedded within the OMPIM 703. The UV blocking region may be layered on either the top or bottom surface of the OMPIM. The UV blocking region may be made from various thin metal films, but also can be made from various other UV-opaque materials, including carbon black, opaque polymer materials, and diffractive optical filters. As shown in FIG. 7B, OMPIM intrusions, such as intrusions 704–707, may include UV blocking regions, and the intrusions may have different lengths. By placing UV-blocking regions as close as possible to the substrate, higher resolution may be obtained.

Although the present invention has been described in terms of a particular embodiment, it is not intended that the invention be limited to this embodiment. Modifications within the spirit of the invention will be apparent to those skilled in the art. For example, OMPIMs may be made of a wide variety of different UV-transparent materials. OMPIMs may also be used in combination with other physical processes to chemically alter underlying polymer layers. For example, longer wavelength radiation may be employed, in which case the OMPIM must be transparent to longer wavelength radiation. In other techniques, the OMPIM may be relatively transparent to certain charged particles, with charged-particle masks layered on, or embedded within, the OMPIM. OMPIMs can be fabricated to imprint an almost limitless number of feature patterns onto layers of semiconductor devices and other electronic, electromechanical, mechanical, or electro-optical devices, with narrow features mechanically imprinted, and wider features obtained by selective, radiation-induced chemical alteration of the layers followed by solvent-based removal of altered portions of the layers. OMPIMs of many different shapes and sizes can be manufactured according to the pattern-imprinting requirements of the particular device. As discussed above, an OMPIM may be employed both for imprinting viscous polymer films or low-viscosity polymer films that are drawn into spaces between intrusions by capillary action.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A method for fabricating features in a polymer layer of a device designed to include micron and sub-micron elements and components, the method comprising:

providing an optical-mechanical pattern-imprinting mask;

mechanically creating narrow, submicorn features within the polymer layer by transferring a pattern from the optical-mechanical pattern-imprinting mask onto the polymer layer; and creating broad features within the polymer layer by transmitting radiation through the optical-mechanical pattern-imprinting mask to selectively expose regions of the polymer to the radiation, leading to differential chemical stability of the exposed regions of the polymer and non-exposed regions of the polymer; and removing regions of the polymer susceptible to a chemical removal method.

2. The method of claim 1 wherein the optical-mechanical pattern-imprinting mask includes intrusions on a surface pressed into the polymer layer.

3. The method of claim 1 wherein the optical-mechanical pattern-imprinting mask includes intrusions on a surface between which low-viscosity polymer solution is drawn by capillary action.

4. The method of claim 1 wherein the optical-mechanical pattern-imprinting mask includes radiation-blocking regions to block exposure of selected polymer regions.

5. The method of claim 4 wherein the radiation is ultraviolet light.

6. The method of claim 5 wherein the polymer is cured by exposure to ultraviolet light, and wherein the radiation-blocking regions correspond to non-feature regions of the polymer.

7. The method of claim 5 wherein the polymer is chemically destabilized by exposure to ultraviolet light, and wherein the radiation-blocking regions correspond to feature regions of the polymer.

8. A device designed to include micron and sub-micron elements and components that includes features produced by the method of claim 1.

9. An optical-mechanical pattern-imprinting mask for fabricating features in a polymer layer of a device designed to include micron and sub-micron elements and components, the optical-mechanical pattern-imprinting mask comprising:

intrusions that, when the optical-mechanical pattern-imprinting mask is pressed against a polymer layer, mechanically create narrow, submicorn features within the polymer layer; and recessed areas, corresponding to broad features, with transparency to radiation suitable to differentially expose regions of the polymer layer underlying the recessed areas to radiation passing through portions of the optical-mechanical pattern-imprinting mask, leading to differential chemical stability between regions of the polymer exposed to transmitted radiation and regions of the polymer not exposed to transmitted radiation, so that, when the optical-mechanical pattern-imprinting mask is pressed against the polymer layer and the optical-mechanical pattern-imprinting mask is exposed to radiation, broad features underlying the recessed areas are subsequently created by removing from the broad features polymer susceptible to a chemical removal method.

10. The optical-mechanical pattern-imprinting mask of claim 9 wherein the recessed areas corresponding to broad features include radiation blocks that block transmission of radiation through the optical-mechanical pattern-imprinting mask and wherein the polymer is cured by exposure to radiation.

11. The optical-mechanical pattern-imprinting mask of claim 9 wherein the recessed areas corresponding to broad features transmit radiation through the optical-mechanical pattern-imprinting mask, wherein remaining areas of the optical-mechanical pattern-imprinting mask block transmission of radiation, and wherein the polymer is destabilized by exposure radiation.

* * * * *